US011157060B2

United States Patent
Brown et al.

(10) Patent No.: US 11,157,060 B2
(45) Date of Patent: Oct. 26, 2021

(54) SYSTEMS AND METHODS FOR CHASSIS-LEVEL PERSISTENT MEMORY SEQUENCING AND SAFETY

(71) Applicant: Dell Products L.P., Round Rock, TX (US)

(72) Inventors: Michael E. Brown, Austin, TX (US); Marshal F. Savage, Austin, TX (US); Aaron M. Rhinehart, Georgetown, TX (US); Kyle E. Cross, Austin, TX (US); Michael W. Daniele, Hudson, NH (US); Jitendra G. Jagasia, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 315 days.

(21) Appl. No.: 16/128,209

(22) Filed: Sep. 11, 2018

(65) Prior Publication Data

US 2020/0081514 A1    Mar. 12, 2020

(51) Int. Cl.
| | |
|---|---|
| *G06F 1/3212* | (2019.01) |
| *H05K 7/14* | (2006.01) |
| *G06F 1/26* | (2006.01) |
| *G06F 11/20* | (2006.01) |
| *G06F 11/14* | (2006.01) |

(52) U.S. Cl.
CPC ............ *G06F 1/3212* (2013.01); *G06F 1/263* (2013.01); *G06F 11/1441* (2013.01); *G06F 11/2015* (2013.01); *H05K 7/1492* (2013.01)

(58) Field of Classification Search
CPC .................................................... G06F 1/3212
See application file for complete search history.

(56) References Cited

U.S. PATENT DOCUMENTS

| 2010/0169690 A1* | 7/2010 | Mundada | G06F 1/3225 713/340 |
| 2016/0118121 A1* | 4/2016 | Kelly | G11C 14/009 710/301 |
| 2018/0365147 A1* | 12/2018 | Fevrier | G06F 12/0804 |

\* cited by examiner

*Primary Examiner* — Kim Huynh
*Assistant Examiner* — Joshua Neveln
(74) *Attorney, Agent, or Firm* — Jackson Walker L.L.P.

(57) ABSTRACT

A method may include, in a chassis configured to provide a common hardware infrastructure to one or more modular information handling systems inserted into the chassis: determining if a save operation is occurring at a time when one or more power supply units are capable of delivering power to the chassis; and delaying power sequencing of the one or more power supply units until the save operation has completed.

8 Claims, 3 Drawing Sheets

SYSTEMS AND METHODS FOR CHASSIS-LEVEL PERSISTENT MEMORY SEQUENCING AND SAFETY

TECHNICAL FIELD

The present disclosure relates in general to information handling systems, and more particularly to methods and systems for sequencing and safety of persistent memory of modular systems when used in an information handling system chassis.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are increasingly using persistent memory technologies such as Non-Volatile Dual In-line Memory Modules (NVDIMMs). An NVDIMM is a memory module that may retain data even when electrical power is removed whether from an unexpected power loss, system crash, or from a normal system shutdown. To enable such functionality, an NVDIMM may include a traditional dynamic random access memory (DRAM) which may store data during normal operation when electrical power is available from one or more power supply units and a flash memory to back up data present in the DRAM when a loss of electrical power from the power supply units occurs. A battery, capacitor, or other energy storage device either internal or external to the NVDIMM may supply electrical energy for a "save" operation to transfer data from the DRAM to the flash memory in response to a power loss event from the power supply units. The transfer of data from DRAM to flash memory is not typically visible to an operating system executing on an information handling system, instead being performed as a background operation on the NVDIMM itself.

Performing save operations in such manner may leave a few instances in which data persistency may be put at risk. One situation in when electrical power is unexpectedly removed from an information handling system. Another situation is when electrical power returns unexpectedly following an unexpected power loss. Both of these situations may lead to data loss if not properly handled. In a monolithic server, a battery-backed NVDIMM must immediately flush its contents to flash, while preventing the information handling system from powering back on until the save operation is completed.

These problems are amplified in a chassis environment in which a chassis may receive one or more modular host information handling systems (e.g., sleds). For instance, in a chassis environment, the system must figure out if persistency of memory can be safely enabled and interlock modular sleds so that memory persistency is not enabled if unsafe to do so. In a chassis environment, each individual modular sled may have a battery backup. Upon a power loss, the battery backup may back-feed power to the main power rails of the chassis. If this situation is present, it is not safe for power from power supply units to return to the main power rails as it could cause damage to the batteries and/or glitches that result in data loss.

In addition, in normal system operation without the presence of persistent memory, an information handling system may try to "ride through" brownout conditions in hopes that sufficient power will be restored to continue normal operation before power supply units completely cease to deliver energy. However, when persistent memory is present and enabled, the ride through behavior may need to be curtailed to retain enough energy to start the save operation, which impacts the system's ability to ride through brownouts.

SUMMARY

In accordance with the teachings of the present disclosure, the disadvantages and problems associated with existing approaches to maintaining persistent memory in a chassis environment may be reduced or eliminated.

In accordance with embodiments of the present disclosure, a method may include, in a chassis configured to provide a common hardware infrastructure to one or more modular information handling systems inserted into the chassis: receiving information from one of the one or more modular information handling systems regarding whether such modular information handling system is persistent memory equipped; responsive to receipt of the information and determination that such modular information handling system is persistent memory equipped, configuring a management controller for chassis-level management of the chassis to trigger persistent memory save operations chassis-wide to each of the one or more modular information handling systems that are persistent memory equipped in response to a fault of a power system of the chassis; and responsive to receipt of the information and determination that none of the one or more modular information handling systems is not persistent memory equipped, performing one or more configurations to maintain operation of the one or more modular information handling systems through ride through of the one or more modular information handling systems in response to the fault of the power system of the chassis.

In accordance with these and other embodiments of the present disclosure, a method may include, in a chassis configured to provide a common hardware infrastructure to one or more modular information handling systems inserted into the chassis: determining if a save operation is occurring at a time when one or more power supply units are capable of delivering power to the chassis; and delaying power sequencing of the one or more power supply units until the save operation has completed.

In accordance with these and other embodiments of the present disclosure, an article of manufacture may include a non-transitory computer-readable medium and computer-executable instructions carried on the computer-readable medium, the instructions readable by a processor, the instructions, when read and executed, for causing the processor to, in a chassis configured to provide a common hardware infrastructure to one or more modular information handling systems inserted into the chassis: receive information from one of the one or more modular information handling systems regarding whether such modular information handling system is persistent memory equipped; responsive to receipt of the information and determination that such modular information handling system is persistent memory equipped, configure a management controller for chassis-level management of the chassis to trigger persistent memory save operations chassis-wide to each of the one or more modular information handling systems that are persistent memory equipped in response to a fault of a power system of the chassis; and responsive to receipt of the information and determination that none of the one or more modular information handling systems is not persistent memory equipped, perform one or more configurations to maintain operation of the one or more modular information handling systems through ride through of the one or more modular information handling systems in response to the fault of the power system of the chassis.

In accordance with these and other embodiments of the present disclosure, an article of manufacture may include a non-transitory computer-readable medium and computer-executable instructions carried on the computer-readable medium, the instructions readable by a processor, the instructions, when read and executed, for causing the processor to, in a chassis configured to provide a common hardware infrastructure to one or more modular information handling systems inserted into the chassis: determine if a save operation is occurring at a time when one or more power supply units are capable of delivering power to the chassis; and delay power sequencing of the one or more power supply units until the save operation has completed.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
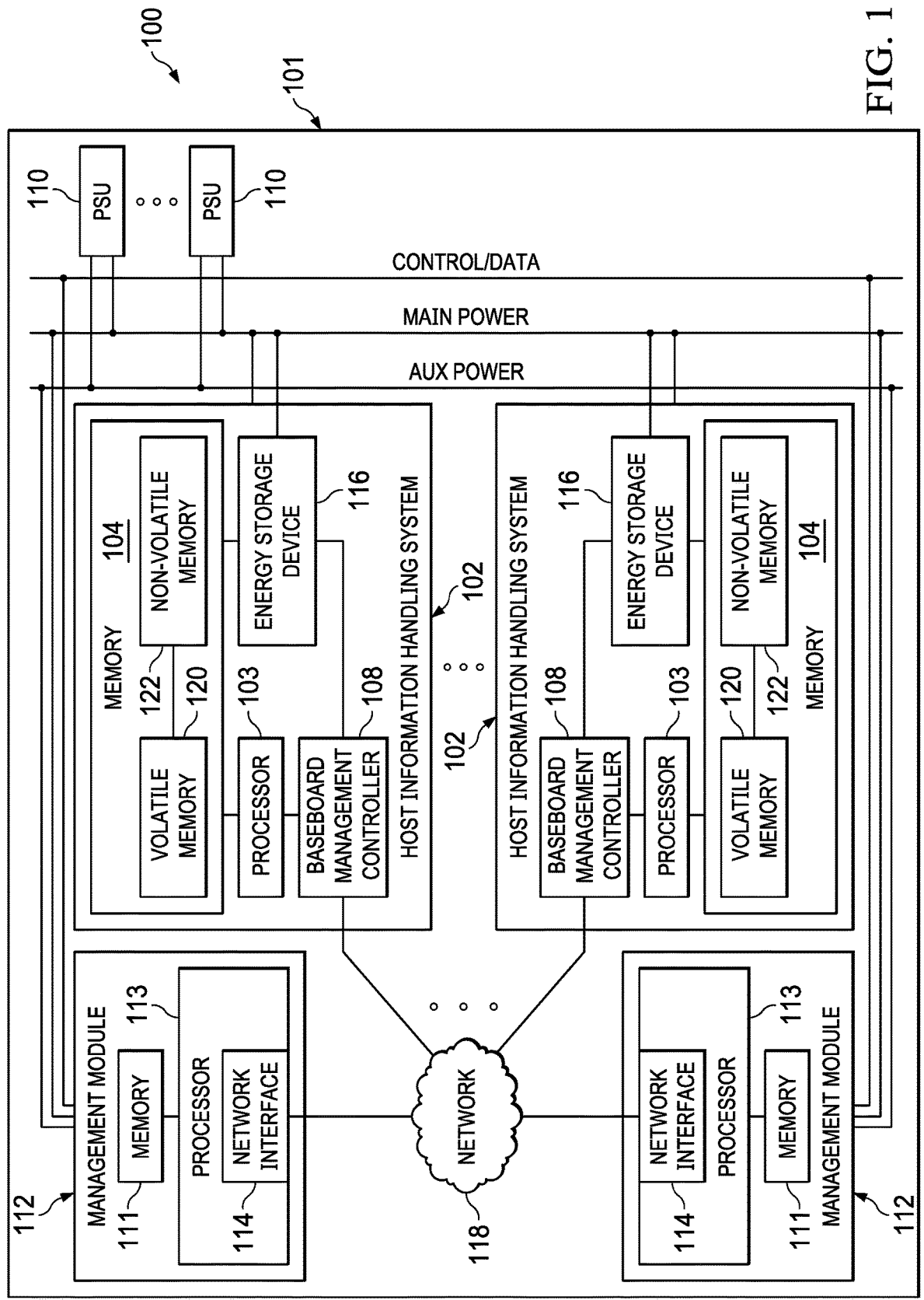
FIG. 1 illustrates a block diagram of an example system, in accordance with embodiments of the present disclosure.
Figure 2:
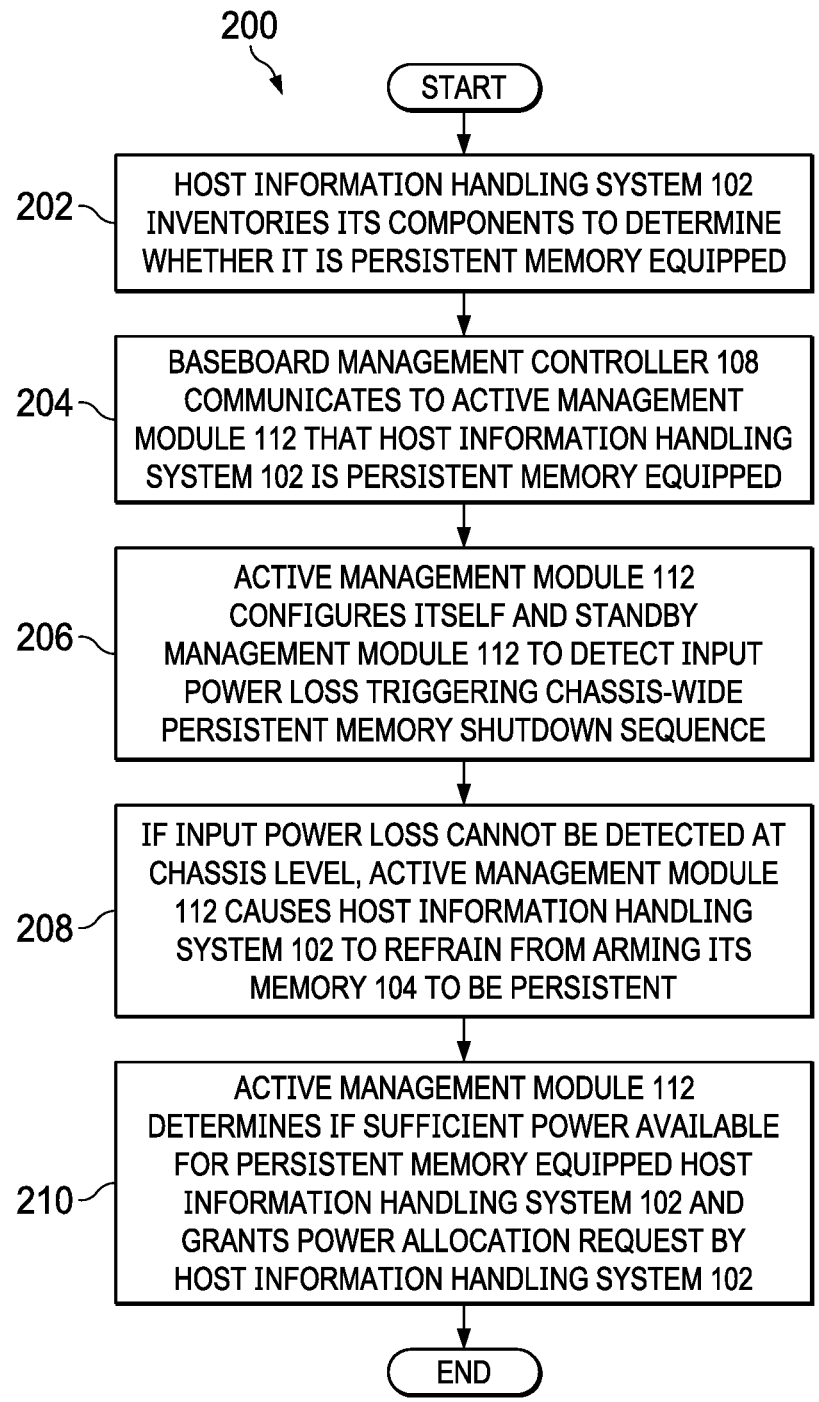
FIG. 2 illustrates a flow chart of an example method for communicating that a persistent memory equipped host information handling system has requested to be powered on in a system and enabling a power down sequence for preserving data stored in a persistent memory after a power loss event, in accordance with embodiments of the present disclosure.
Figure 3:
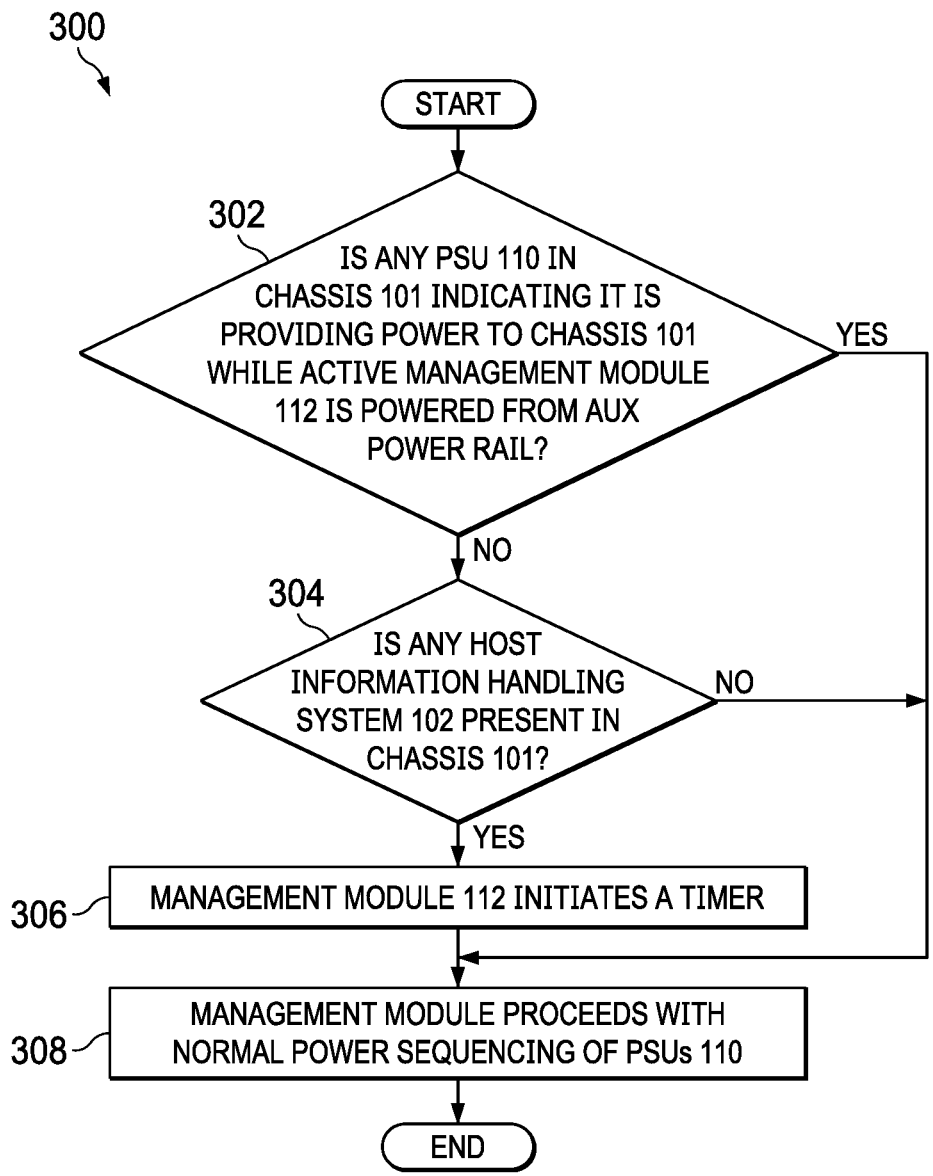
FIG. 3 illustrates a flow chart of an example method for detecting that a save operation is in progress after input power is restored to components of a chassis, in accordance with embodiments of the present disclosure.

Preferred embodiments and their advantages are best understood by reference to FIGS. 1 through 3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

FIG. 1 illustrates a block diagram of an example system 100, in accordance with embodiments of the present disclosure. As shown in FIG. 1, system 100 may comprise a chassis 101 for enclosing a plurality of information handling resources, including a plurality of modular host information handling systems 102 (e.g., sleds), one or more management modules 112, an internal network 118, and a power system comprising one or more power supply units (PSUs) 110.

Chassis 101 may include any suitable enclosure for housing the various components of system 100, and may also be referred to as a rack, tower, enclosure, and/or housing.

As shown in FIG. 1, a host information handling system 102 may include a processor 103, a memory 104 communicatively coupled to processor 103, a baseboard management controller 108 communicatively coupled to processor 103, and an energy storage device 116.

A processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in an associated memory 104 and/or another component of its associated information handling system 102.

A memory 104 may be communicatively coupled to an associated processor 103 and may include any system, device, or apparatus configured to retain program instructions and/or data for a period of time (e.g., computer-readable media). A memory 104 may include RAM, EEPROM, a PCMCIA card, flash memory, magnetic storage, opto-magnetic storage, or any suitable selection and/or array of volatile or non-volatile memory that retains data after power to information handling system 102 is turned off. As shown in FIG. 1, memory 104 may comprise a persistent memory (e.g., comprising one or more NVDIMMs) that includes a volatile memory 120 (e.g., DRAM or other volatile random-access memory) and non-volatile memory 122 (e.g., flash memory or other non-volatile memory). During normal operation, when PSUs 110 provide adequate power to components of information handling system 102, data written to memory 104 from processor 103 may be stored in volatile memory 120. However, in the event of loss of system input power or a power fault of PSUs 110 that prevents delivery of adequate electrical energy from PSUs 110 to memory 104, data stored in volatile memory 120 may be transferred to non-volatile memory 122 in a save operation. After input power is restored, or a faulty PSU 110 is replaced, such that PSUs 110 are again operable to provide sufficient electrical energy to information handling resources of an information handling system 102, on the subsequent power-on of information handling system 102, data may be copied from the non-volatile memory 122 back to volatile memory 120 via a restore operation. The combined actions of data save and then data restore allows the data to remain persistent through a power disruption. Although not explicitly shown in FIG. 1, memory 104 may also include hardware, firmware, and/or software for carrying out save operations.

A baseboard management controller 108 may be configured to provide out-of-band management facilities for management of information handling system 102. Such management may be made by baseboard management controller 108 even if information handling system 102 is powered off or powered to a standby state. In certain embodiments, baseboard management controller 108 may include or may be an integral part of a remote access controller (e.g., a Dell Remote Access Controller of Integrated Dell Remote Access Controller).

An energy storage device 116 may comprise any system, device, or apparatus configured to store energy which may be used by memory 104 to perform save operations in response to a loss of an alternating current input source of other power fault of one or more PSUs 110. In some embodiments, energy storage device 116 may comprise a battery configured to convert stored chemical energy into electrical energy. In other embodiments, energy storage device 116 may comprise a capacitor or "supercap" configured to store electrical energy and deliver such electrical energy to memory 104 when needed to perform save operations (e.g., by closure of a switch to electrically couple such capacitor to components of memory 104). Although energy storage device 116 is shown in FIG. 1 as external to memory 104, in some embodiments energy storage device 116 may be integral to memory 104. In these and other embodiments, energy storage device 116 may be charged from one or more PSUs 110. In some embodiments, an energy storage device 116 may be communicatively coupled to an associated baseboard management controller 108 via a systems management interface such as, for example, Inter-Integrated Circuit (i2C), System Management Bus (SMBus) or Power Management Bus (PMBus), allowing baseboard management controller 108 to receive health and status (e.g., state of charge) from and/or communicate commands to energy storage device 116. In some embodiments, energy storage device 116 may provide energy to a plurality of persistent memory 104 devices.

Although, for the purposes of clarity and exposition, FIG. 1 depicts only two host information handling systems 102 within system 100, it is understood that system 100 may comprise any suitable number of host information handling systems 102.

In addition to a processor 103, a memory 104, a baseboard management controller 108, and an energy storage device 116, a host information handling system 102 may include one or more other information handling resources. For example, in some embodiments, information handling system 102 may include more than one energy storage device 116 and/or more than one memory 104.

A management module 112 may be configured to provide out-of-band management facilities for management of shared chassis infrastructure of system 100, such as air movers, PSUs 110, and/or other components shared by a plurality of host information handling systems 102. Such management may be made by management module 112 even if system 100 is powered off or powered to a standby state. Management module 112 may include a processor 113 and one or more memories 111. In certain embodiments, management module 112 may include or may be an integral part of an enclosure controller. In other embodiments, management module 112 may include or may be an integral part of a chassis management controller (CMC).

Processor 113 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 113 may interpret and/or execute program instructions (e.g., firmware) and/or process data stored in memory 111 and/or another component of system 100 or management module 112. In some embodiments, processor 113 may comprise an enclosure controller configured to execute firmware relating to functionality as an enclosure controller. As shown in FIG. 1, processor 113 may include a network interface 114 for communicating with an internal network 118 of system 100.

Memory 111 may be communicatively coupled to processor 113 and may include any system, device, or apparatus configured to retain program instructions and/or data for a period of time (e.g., computer-readable media). Memory 111 may include RAM, EEPROM, a PCMCIA card, flash memory, magnetic storage, opto-magnetic storage, or any suitable selection and/or array of volatile or non-volatile memory that retains data after power to management module 112 is turned off.

Internal network 118 may comprise any suitable system, apparatus, or device operable to serve as communication infrastructure for network interfaces 114 to communicate to one another and one or more other components, such as baseboard management controllers 108 of host information handling systems 102.

At a given moment, one management module 112 may be "active" in that it is actively functional and performing its functionality, while another management module 112 is in a "standby" mode and may become active in the event that the active management module 112 experiences a fault or failure that causes it to failover to the standby management module 112.

Generally speaking, a PSU 110 may include any system, device, or apparatus configured to supply electrical current to one or more information handling resources of system 100. As shown in FIG. 1, a PSU 110 may provide electrical energy via (a) a main power rail, indicated in FIG. 1 as "MAIN POWER," and (b) an auxiliary power rail, indicated in FIG. 1 as "AUX POWER." The main power rail may generally be used to provide power to information handling resources of a host information handling system 102 when such host information handling system 102 is turned on and/or to provide power to certain components of system 100. On the other hand, the auxiliary power rail may generally be used to provide power to certain auxiliary information handling resources when energy is not supplied via the main power rail. For example, the auxiliary power rail may be used to provide power to baseboard management controller 108 when electrical energy is not provided to processor 103, memory 104, and/or other information handling resources via the main power rail. As another example, the auxiliary power rail may be used to provide power to management module 112 when electrical energy is not provided to host information handling resources 102 via the main power rail.

In some embodiments, a management module 112 may be configured to communicate with one or more PSUs 110 to communicate control and/or telemetry data between management module 112 and PSUs 110. For example, a PSU 110 may communicate information regarding status and/or health of such PSU 110 and/or measurements of electrical parameters (e.g., electrical currents or voltages) present within such PSU 110.

In addition to host information handling systems 102, management modules 112, internal network 118, and PSUs 110, system 100 may include one or more other information handling resources.

Further, while FIG. 1 depicts system 100 as having two persistent-memory equipped host information handling systems 102, it is understood that system 100 may be capable of receiving modular host information handling systems 102 of varying forms, functions, and/or structures. For example, in some embodiments, a host information handling system 102 present in system 100 may include only non-persistent memory.

FIG. 2 illustrates a flow chart of an example method 200 for communicating that a persistent memory equipped host information handling system 102 has requested to be powered on in system 100 and enabling a power down sequence for preserving data stored in a persistent memory after a power loss event, in accordance with embodiments of the present disclosure. According to some embodiments, method 200 may begin at step 202. As noted above, teachings of the present disclosure may be implemented in a variety of configurations of information handling system 102. As such, the preferred initialization point for method 200 and the order of the steps comprising method 200 may depend on the implementation chosen.

At step 202, responsive to a host information handling system 102 being installed in chassis 101 and powered on, such host information handling system 102 may inventory its components (e.g., during power-on self-test) to determine whether it is persistent memory equipped.

At step 204, responsive to the host information handling system 102 being persistent memory equipped, baseboard management controller 108 may communicate to an active management module 112 that the host information handling system 102 is persistent memory equipped. In some embodiments, this communication regarding whether the host information handling system 102 is persistent memory equipped may take place after the host information handling system 102 is inventoried and as a part of a chassis/host power allocation request sequence.

In response, at step 206, the active management module 112 may configure itself and standby management module 112 to detect an input power loss that may trigger a chassis-wide persistent memory shutdown sequence. Accordingly, during operation of system 100, if the number of healthy PSUs 110 drops below the minimum number of PSUs 110 required for sustained operation, active management module 112 may trigger a chassis-wide persistent memory shutdown sequence in order to preserve the persistence of data stored in persistent memory of persistent memory equipped host information handling systems 102.

At step 208, in the event that active management controller 112 determines that an input power loss cannot be detected at the chassis level, active management module 112 may cause the host information handling system 102 to refrain from arming its memory 104 to be persistent.

At step 210, the active management module 112 may determine if there is enough power available for the persistent memory equipped host information handling system 102. This may be performed by configuring the management modules 112 with a variable (e.g., MIN_PSU_COUNT) defining a minimum number of PSUs 110 required for sustained operation. Thus, if the number of healthy PSUs 110 is at or above the variable, the active management module 112 may grant the power allocation request by the host information handling system 102.

After step 210, method 200 may end.

Although FIG. 2 discloses a particular number of steps to be taken with respect to method 200, method 200 may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented using a host information handling system 102, management module 112, and/or any other system operable to implement method 200. In certain embodiments, method 200 may be implemented partially or fully in software and/or firmware embodied in computer-readable media.

While step 204 of method 200 may execute responsive to the host information handling system 102 being persistent memory equipped, in response to determining that no persistent memory equipped host information handling systems 102 are present in chassis 101, the active management controller 112 may configure the variable (e.g., MIN_PSU_COUNT) defining a minimum number of PSUs 110 required for sustained operation to a value of zero, and configure the standby management controller 112 in a similar manner. To illustrate, when at least one persistent memory equipped host information handling system 102 is present in chassis 101, the variable (e.g., MIN_PSU_COUNT) defining a minimum number of PSUs 110 required for sustained operation may be greater than zero. However, when the last persistent memory equipped host information handling system 102 present in chassis 101 is removed or powered down, the variable may be configured to zero. Accordingly, management controller 112 may not initiate a persistent memory power down and save sequence when input power becomes less than what is required to sustain full operation. Instead, when the last persistent memory equipped host information handling system 102 present in chassis 101 is removed or powered down, the variable may be configured to zero such that in response to power faults of PSUs 110, one or more "fight-for-life" behaviors (e.g., throttling, other power limiting features, ride-through, etc.) may instead be triggered.

In a modular chassis such as chassis 101, energy storage devices 116 that provide power to persistent memories 104 during a save process may all be tied together on a common power rail (e.g., MAIN POWER) to provide power to chassis infrastructure such as air movers (e.g. cooling fans) during the save operation. These energy storage devices may be designed to share current but may not be configured to be driven from an external power source. Such energy storage devices 116 may operate at a lower voltage than the normal output voltage of PSUs 110, so if a PSU 110 were to turn on when the MAIN POWER rail is powered by energy storage devices 116, a power disruption causing data loss or damage to the energy storage devices 116 could occur. In a modular chassis such as chassis 101, a save operation may take a significant time (e.g., 140 seconds) to complete. Accordingly, there is a distinct possibility that any input power disruption to system 100 is shorter than such completion time. Therefore a process to detect if a save operation is in progress may be desirable prior to enabling the main output of PSUs 110 in chassis 101. A method for performing such process is illustrated by method 300, described below.

FIG. 3 illustrates a flow chart of an example method 300 for detecting that a save operation is in progress after input power is restored to components of chassis 101, in accordance with embodiments of the present disclosure. According to some embodiments, method 300 may begin at step 302. As noted above, teachings of the present disclosure may be implemented in a variety of configurations of information handling system 102. As such, the preferred initialization point for method 300 and the order of the steps comprising method 300 may depend on the implementation chosen.

At step 302, the active management module 112 may detect if any of PSUs 110 in chassis 101 indicate that they are providing power to chassis 101 (e.g., if any PSU 110 is asserting a "power OK" signal) while the active management module 112 is powered from the AUX power rail. If any of PSUs 110 in chassis 101 indicate that they are providing power to chassis 101 (e.g., if any PSU 110 is asserting a "power OK" signal) while the active management module 112 is powered from the AUX power rail, method 300 may proceed to step 308. Otherwise, if no PSUs 110 are not providing power to the MAIN POWER rail, method 300 may proceed to step 304.

At step 304, the active management module 112 may determine if any host information handling system 102 is present in chassis 101. Because host information handling systems 102 may only be powered from the MAIN POWER rail, from the presence of a host information handling system 102, the active management module 112 may infer that the MAIN POWER rail is being powered from one or more energy storage devices 116, and thus infer that a save operation is in progress. Thus, if active management module 112 determines that any host information handling system 102 is present in chassis 101, method 300 may proceed to step 306. Otherwise, method 300 may proceed to step 308.

At step 306, to ensure that energy storage devices 116 cease powering the MAIN POWER rail before beginning the power sequencing of PSUs 110 that allows PSUs 110 to drive the MAIN POWER rail, management module 112 may initiate a timer (e.g., 175 seconds) longer than that of an expected duration of a save operation (e.g., 140 seconds) to ensure the save operation completes, while also ensuring that system 100 will not hang waiting indefinitely for the save operation to complete. After completion of the timer, method 300 may proceed to step 308.

At step 308, management module 112 may proceed with normal power sequencing of PSUs 110, thus allowing PSUs 110 to drive the MAIN POWER rail. After completion of step 308, method 300 may end.

Although FIG. 3 discloses a particular number of steps to be taken with respect to method 300, method 300 may be executed with greater or fewer steps than those depicted in FIG. 3. In addition, although FIG. 3 discloses a certain order of steps to be taken with respect to method 300, the steps comprising method 300 may be completed in any suitable order.

Method 300 may be implemented using a host information handling system 102, management module 112, and/or any other system operable to implement method 300. In certain embodiments, method 300 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method comprising, in a chassis configured to provide a common hardware infrastructure to one or more modular information handling systems inserted into the chassis:
    receiving information from one of the one or more modular information handling systems regarding whether such modular information handling system is persistent memory equipped;
    responsive to receipt of the information and determination that such modular information handling system is persistent memory equipped, configuring a management controller for chassis-level management of the chassis to trigger persistent memory save operations chassis-wide to each of the one or more modular information handling systems that are persistent memory equipped in response to a fault of a power system of the chassis;
    responsive to receipt of the information and determination that none of the one or more modular information handling systems is persistent memory equipped, performing one or more configurations to maintain operation of the one or more modular information handling systems through ride through of the one or more modular information handling systems in response to the fault of the power system of the chassis;
    determining whether the management module includes an ability to detect power faults at a chassis level; and
    responsive to determining the management module lacks the ability to detect power faults at a chassis level, preventing the one or more modular information handling systems from enabling their respective memories for save operation.

2. The method of claim 1, wherein the one or more configurations to maintain operation of the one or more modular information handling systems through ride through may comprise restricting power consumption of one or more information handling resources of the chassis.

3. The method of claim 1, wherein the information is received via a power allocation request by the one or more modular information handling resources.

4. The method of claim 3, further comprising granting the power allocation request if it is determined that sufficient power is available to grant the power allocation request.

5. An article of manufacture comprising:
    a non-transitory computer-readable medium; and
    computer-executable instructions carried on the computer-readable medium, the instructions readable by a processor, the instructions, when read and executed, for causing the processor to, in a chassis configured to provide a common hardware infrastructure to one or more modular information handling systems inserted into the chassis:
    receive information from one of the one or more modular information handling systems regarding whether such modular information handling system is persistent memory equipped;
    responsive to receipt of the information and determination that such modular information handling system is persistent memory equipped, configure a management controller for chassis-level management of the chassis to trigger persistent memory save operations chassis-wide to each of the one or more modular information handling systems that are persistent memory equipped in response to a fault of a power system of the chassis;
    responsive to receipt of the information and determination that none of the one or more modular information handling systems is persistent memory equipped, perform one or more configurations to maintain operation of the one or more modular information handling systems through ride through of the one or more modular information handling systems in response to the fault of the power system of the chassis;
    determining whether the management module includes an ability to detect power faults at a chassis level; and
    responsive to determining the management module lacks the ability to detect power faults at a chassis level, preventing the one or more modular information handling systems from enabling their respective memories for save operation.

6. The article of claim 5, wherein the one or more configurations to maintain operation of the one or more modular information handling systems through ride through may comprise restricting power consumption of one or more information handling resources of the chassis.

7. The article of claim 5, wherein the information is received via a power allocation request by the one or more modular information handling resources.

8. The article of claim 7, the instructions for further causing the processor to grant the power allocation request if it is determined that sufficient power is available to grant the power allocation request.

* * * * *